United States Patent [19]

Taneya et al.

[11] Patent Number: 4,813,051
[45] Date of Patent: Mar. 14, 1989

[54] SEMICONDUCTOR LASER ARRAY DEVICE

[75] Inventors: Mototaka Taneya, Nara; Mitsuhiro Matsumoto, Tenri; Hidenori Kawanishi, Higashiosaka; Sadayoshi Matsui, Tenri, all of Japan

[73] Assignee: 501 Sharp Kabushiki Kaisha, Osaka, Japan

[21] Appl. No.: 5,056

[22] Filed: Jan. 20, 1987

[30] Foreign Application Priority Data

Jan. 21, 1986 [JP] Japan .................................. 61-11532

[51] Int. Cl.⁴ ................................................. H01S 3/19
[52] U.S. Cl. ..................................... 372/150; 357/17; 372/45; 372/46
[58] Field of Search ..................................... 372/44–46, 372/50; 357/55, 56, 17; 350/96.12

[56] References Cited

U.S. PATENT DOCUMENTS 4,156,452  6/1979  Logan et al. ..................... 350/96.12

FOREIGN PATENT DOCUMENTS 010949   5/1980  European Pat. Off. .
115390   8/1984  European Pat. Off. .
3332472  3/1984  Fed. Rep. of Germany .
0190386 11/1982  Japan ..................... 372/45
60-89990  5/1985  Japan .
60-176289 9/1985  Japan .
2166903 10/1984  United Kingdom .
2170650  1/1986  United Kingdom .

OTHER PUBLICATIONS

M. Taneya et al., *Appl. Phys. Lett.* (1985)47:341–343 "0° Phase Mode Operation in Phased-Array Laser Diode with Symmetrically Branching Waveguide".

Primary Examiner—William L. Sikes
Assistant Examiner—Georgia Y. Epps
Attorney, Agent, or Firm—Ciotti, Murashige, Irell & Manella

[57] ABSTRACT

A semiconductor laser array device comprising an active waveguide extending from one light-emitting facet to the other light-emitting facet, wherein said active waveguide is composed of a single main portion extending in the oscillation direction from said one light-emitting facet and constituting a loss waveguide, and a plurality of parallel branching portions extending from the end of said main portion to said other light-emitting facet and constituting a real index waveguide.

2 Claims, 6 Drawing Sheets

SEMICONDUCTOR LASER ARRAY DEVICE

BACKGROUND OF THE INVENTION

1. Field of the Invention

This invention relates to a semiconductor laser array device which oscillates laser light in a 0° phase-shift mode up to a high output power.

2. Description of the Prior Art

Semiconductor laser devices which are useful as light sources for optical discs, laser printers, optical measuring systems, etc., must produce high output power. However, conventional semiconductor laser devices having a single waveguide structure can only produce low output power, 60–70 mW at their best, even taking into account their window effects and/or the reflectivity control at their facets. In order to oscillate laser light in a certain array mode (i.e., a 0° phase-shift mode, resulting in a single narrow beam with higher output power), semiconductor laser array devices, in which a plurality of waveguides are fabricated in a parallel manner to achieve an optical phase-coupling between the adjacent waveguides, have been studied. However, the optical phase-shift between the adjacent waveguides of these devices is, indeed, 180°, and output power light is emitted in a two-beam fashion having a certain angle therebetween, resulting in a far-field pattern having two peaks. Thus, this laser light cannot be condensed into a diffraction limited spot by means of any known optical lens. In order to use these semiconductor laser array devices as light sources of optical discs, laser printers, etc., they must oscillate laser in a single array mode and emit output power light with a single narrow beam.

FIGS. 4 and 5 show a conventional semiconductor laser array device, which can be produced as follows: On the (001) plane of a p-GaAs substrate 101, an n$^+$-Al$_{0.1}$Ga$_{0.9}$As current blocking layer 102 having a thickness of 0.7 μm and an n-GaAs surface-protective layer 103 having a thickness of 0.1 μm are successively formed by liquid phase epitaxy. Then, three straight channels 108 are formed in a parallel manner through both the surface-protective layer 103 and the current blocking layer 102 into the p-GaAs substrate 101. Each of the channels 108 has a width of 4 μm and a depth of about 1 μm. The distance from the center of one channel to that of the adjacent channel is 5 μm. These channels 108 are disposed at right angles to the (110) plane which corresponds to each of the facets of the device. Then, on the n-GaAs surface-protective layer 103 including the channels 108, a p-Al$_{0.42}$Ga$_{0.58}$As cladding layer 104 having a thickness of 0.2 μm in the portions to the outside of the channels 108, a p- or n-Al$_{0.14}$Ga$_{0.86}$As active layer 105 having a thickness of 0.08 μm, an n-Al$_{0.42}$Ga$_{0.58}$As cladding layer 106 having a thickness of 0.8 μm and an n+-GaAs contact layer 107 having a thickness of 1.5 μm are successively formed by liquid phase epitaxy. Since the channels 108 are filled with the p-cladding layer 104, the surface of each of the layers 104, 105, 106 and 107 is flat. Then, the upper face of the contact layer 107 and the back face of the substrate 101 are subjected to a vapor deposition treatment with metallic materials and then heated to from ohmic contacts thereon made of alloys of the metallic materials, followed by cleaving at the (110) plane of the wafer, resulting in a conventional semiconductive laser array device.

The optical field distribution of beams oscillated by the conventional laser array device and the far-field pattern attained by the conventional laser array device are shown in FIGS. 6 and 7, respectively, indicating that the optical phase-shift between the adjacent waveguides is 180°.

The reason why the conventional semiconductor laser array device having a plurality of waveguides is operated in a 180° phase-shift mode is that laser light is absorbed by the optical coupling area between the adjacent waveguides, which makes threshold gain of the 180° phase-shift mode significantly low.

The above-mentioned phenomenon that the conventional laser array device is operated in a 180° phase-shift mode can be also explained by reference to FIG. 8, which shows the dependence of the threshold gain of all possible array modes ($\nu=1$, 2 and 3) of a triple lasing filament array on the difference in the refractive index in the lateral direction. This dependence is obtained by a calculation analysis of the waveguides. It can be also seen from FIG. 8 that the conventional laser array device selectively and stably oscillates laser light in a 180° phase-shift mode. As mentioned above, such a 180°, phase-shift mode attains a far-field pattern having two peaks, which causes difficulty in condensing the laser light into a diffraction limited spot by means of any known optical lens.

Moreover, the conventional laser array device oscillates laser light in an array mode other than the 0° phase-shift mode and the 180° phase-shift mode, thereby producing output light with a plurality of beams. In addition, two or more array modes are mixed without interference therebetween, thereby producing output light with broad beams.

A semiconductor laser array device having an effective index-guided structure in which optical loss in the optical coupling area is zero has been proposed, which is shown in FIG. 9. The production of this laser array device is as follows: On the (001) plane of a p-GaAs substrate 111, an n-Al$_x$Ga$_{1-x}$As cladding layer 112 having a thickness of 0.8 μm, an n- or p-Al$_y$Ga$_{1-y}$As active layer 113 having a thickness of 0.1 μm, an n-Al$_x$Ga$_{1-x}$As cladding layer 114 having a thickness of 0.8 μm, and a p+-GaAs contact layer 115 having a thickness of 0.1 μm are successively formed by a crystal growth technique such as metal organic-chemical vapor deposition (MOCVD), molecular beam epitaxy (MBE), liquid phase epitaxy (LPE), or the like. Then, ohmic contacts are formed on both sides of the wafer. Three mesa-stripes 116 are then formed in a parallel manner in the wafer by photolithography and a reactive ion-beam etching technique in such a manner that the portion of the n-cladding layer 114 corresponding to the outside of the mesa-stripes 116 has a thickness of 0.3 μm. Each of the mesa-stripes 116 has a width of 3 μm and a height of 1.5 μm. The distance from the center of one mesa-stripe to that of the adjacent mesa-stripe is 4 μm. These mesa-stripes 116 are disposed in the <$\bar{1}$10> direction of the substrate 111. Then, cleavage is carried out in the ($\bar{1}$10) plane of the wafer to form a laser array device 117 having a cavity length of about 250 μm.

The oscillation transverse mode attained by this effective-index guided laser array device is composed of a plurality of array modes. This phenomenon can be explained as follows: This effective-index guided laser array device oscillates laser light in all possible array modes simultaneously because the absorption of light in the optical coupling area does not occur and all of the possible array modes have the same threshold gain, whereas the laser array device shown in FIG. 4 selectively oscillates laser light in a 180° phase-shift mode because laser light is significantly absorbed by the optical coupling area. The breadth of output beams produced by this laser array device which oscillates laser light in a plurality of array modes is several times that of the limited diffraction value, which causes difficulty in the practical use of the laser array device.

As mentioned above, the conventional semiconductor laser array devices oscillate laser in a plurality of array modes, resulting in output light with two or more beams, which causes difficulty in the practical use of the laser array device as light sources in optical systems of laser printers, optical files, etc.

SUMMARY OF THE INVENTION

The semiconductor laser array device of this invention, which overcomes the above-discussed and numerous other disadvantages and deficiencies of the prior art, comprises an active waveguide extending from one light-emitting facet to the other light-emitting facet, wherein said active waveguide is composed of a single main portion extending in the oscillation direction from said one light-emitting facet and constituting a loss waveguide, and a plurality of parallel branching portions extending from the end of said main portion to said other light-emitting facet and constituting a real index waveguide.

In a preferred embodiment, the active waveguide is formed within an active layer corresponding to a mesa positioned near the active layer, an optical absorbent being positioned in the oscillation direction on both sides of the single main portion of said mesa corresponding to the main portion of said active waveguide to thereby constitute the loss waveguide in the main portion of said active waveguide.

In a preferred embodiment, the mesa is formed into a "Y" shape.

Thus, the invention described herein makes possible the objects of (1) providing a semiconductor laser array device which oscillates laser light in a single array mode; and (2) providing a semiconductor laser array mode in which a substance functioning as an optical absorbent is positioned in the oscillation direction on both sides of the single main portion of a mesa corresponding to the active waveguide, resulting in a single 0° phase-mode oscillation to the extent of a high output power level.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

The semiconductor laser array device of this invention is provided with an optical loss region on both sides of the single portion of an active waveguide, thereby attaining oscillation in a 0° phase-shift mode, so that high output power light which is able to be condensed into a diffraction limited spot can be produced.

Figure 1A:
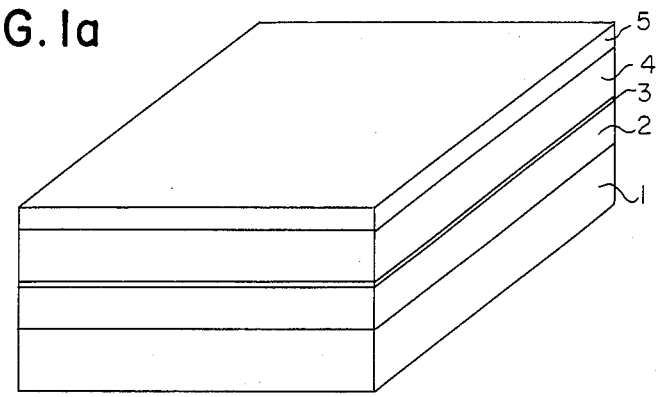
FIGS. 1(a) to 1(d) are schematic diagrams showing the production process of a semiconductor laser array device of this invention.

FIGS. 1(a) to 1(d) show a production process of the semiconductor laser array device of this invention. As shown in FIG. 1(a), on the (001) plane of an n-GaAs substrate 1, an n-$Al_xGa_{1-x}As$ cladding layer 2 having a thickness of 1.0 μm, an $Al_yGa_{1-y}As$ active layer 3 having a thickness of 0.1 μm, a p-$Al_xGa_{1-x}As$ cladding layer 4 having a thickness of 0.8 μm, and a p$^+$-GaAs contact layer 5 having a thickness of 0.4 μm are successively grown by liquid phase epitaxy (LPE), metal organic-chemical vapor deposition (MOCVD), molecular beam epitaxy (MBE), vapor phase epitaxy (VPE), or the like (wherein $0 \leq y < x \leq 1$).

Figure 1B:
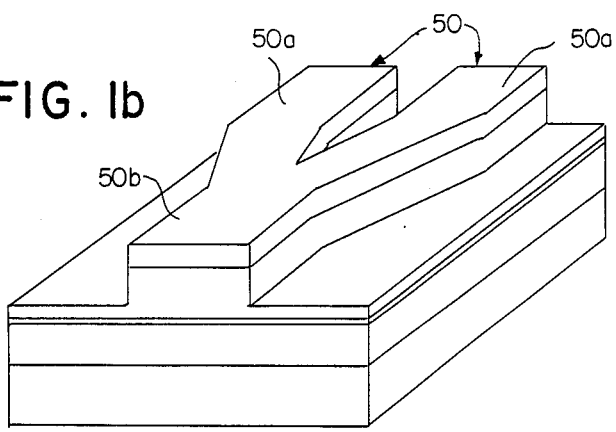

Then, as shown in FIG. 1(b), a "Y" shaped mesa 50 is formed in the p-$Al_xGa_{1-x}As$ layer 4 through the GaAs contact layer 5 by photolithography and a reactive ion-beam etching technique using chlorine gas in such a manner that the p-$Al_xGa_{1-x}As$ layer 4 has a thickness of 0.2 μm on the active layer 3. The "Y" shaped mesa 50 is composed of the two branching portions 50a and 50a with a space therebetween of 1.5 μm, the width of each of which is 3.5 μm, and the main portion 50b, the width of which is 5.5 μm.

Figure 1C:
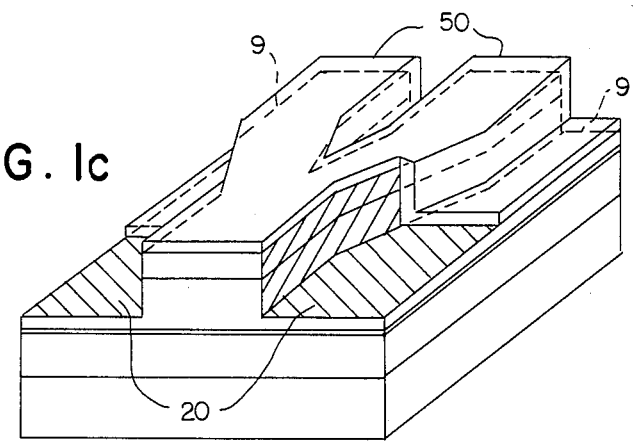

Then, as shown in FIG. 1(c), a $Si_3N_4$ film 9 having a thickness of 0.4 to 0.5 μm is formed on the wafer by plasma assisted chemical vapor deposition (P-CVD), followed by subjecting to a photolithographic treatment and a reactive ion etching treatment with flon gas to remove the portions of the $Si_3N_4$ film 9, resulting in concaves 20 on both sides of the main portion 50b of the "Y" shaped mesa 50.

Figure 1D:
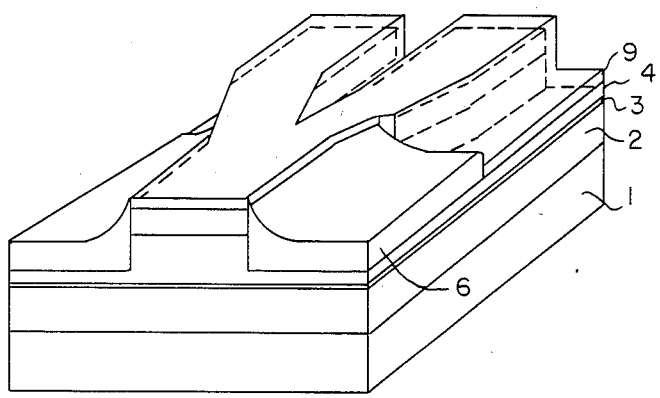

Then, as shown in FIG. 1(d), an n-GaAs optical absorbing layer 6 having a thickness of 0.5 to 1.0 μm is formed on the wafer by metal organic-chemical vapor deposition in such a manner that the GaAs optical absorbing layer 6 is grown in the AlGaAs/GaAs concave 20 alone, but it is not grown on the $Si_3N_4$ film 9.

Figure 2A:
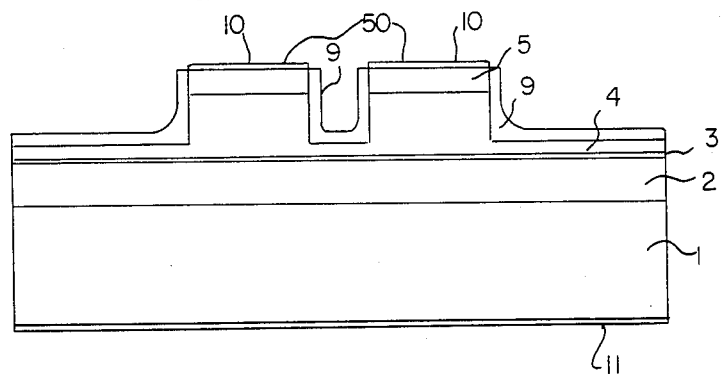
FIGS. 2(a) and 2(b), respectively, are cross sectional views showing the semiconductor laser array device produced by the process shown in FIG. 1.
Figure 2B:
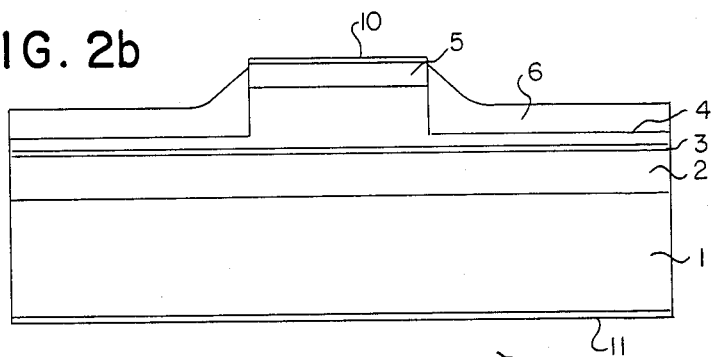

Finally, the wafer is etched to form holes in the $Si_3N_4$ film 9 positioned at the "Y" shaped mesa 50, and, as shown in FIGS. 2(a) and 2(b), p-ohmic contacts 10 are disposed on the each portion of the "Y" shaped mesa 50 through the holes and an n-ohmic contact 11 is disposed on the whole area of the back face of the substrate 1, resulting in a semiconductor laser array device. FIG. 2(a) shows one cross sectional view of the branching portion 50a side of the "Y" shaped mesa 50 of the semiconductor laser array device and FIG. 2(b) shows the other cross sectional view of the main portion 50b side thereof. On both sides of the main portion 50b, the GaAs layer 6 is positioned to function as an optical absorbent against light within the active layer 3 (i.e., resulting in a loss waveguide in the area of the active layer 3 corresponding to the main portion 50b) whereas both sides of each of the branching portions 50a are covered by the $Si_3N_4$ film 9 and optical absorption does not occur (i.e., resulting in a real index waveguide in the area of the active layer 3 corresponding to the branching portions 50a).

As mentioned above, the semiconductor laser array device is provided with a loss waveguide structure and a real index waveguide structure therein in the axis direction thereof, so that the optical loss difference between the 0° phase-shift mode and the other high order array modes can be maximized as a whole for the reasons mentioned below: When the loss waveguide structure is formed by the whole area of the "Y" shaped mesa of the laser array device, loss in the 0° phase-shift mode is smaller than those of the high order array modes in the main portion of the "Y" shaped mesa whereas loss in each of the high order array modes becomes smaller than that of the 0° phase-shift mode in the branching portions of the "Y" shaped mesa. On the other hand, when the real index waveguide structure is formed by the whole area of the "Y" shaped mesa of the laser array device, the loss difference between the 0° phase-shift mode and the high order array modes is nearly zero in both the main portion and the branching portions of the "Y" shaped mesa. In both cases, the laser array device oscillates laser in a mixed array mode of the 0° phase-shift mode and the high order array modes when the output power exceeds over a certain level (e.g., 60 mW), resulting in a distorted far-field pattern. Moreover, the output power characteristics become nonlinear with regard to current, which also causes difficulty in the practical use of the laser array device.

According to this invention, since the branching portions 50a of the "Y" shaped mesa 50 constitutes a real index waveguide and the main portion 50b of the "Y" shaped mesa 50 constitutes a loss waveguide, loss in the 0° phase-shift mode is smaller than those of the high order array modes in both the branching portions 50a and the main portion 50b, resulting in a maximized loss difference between the 0° phase-shift mode and the high order array modes.

Figure 3:
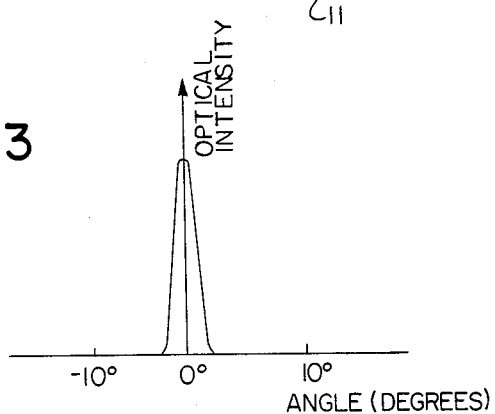
FIG. 3 is a graph showing the far-field pattern attained by the semiconductor laser array device shown in FIG. 1.
Figure 4:
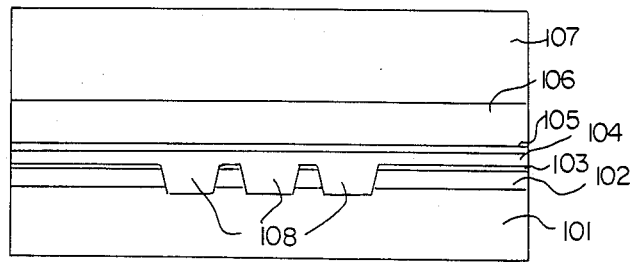
FIG. 4 is a front sectional view showing a conventional semiconductor laser array device.
Figure 5:
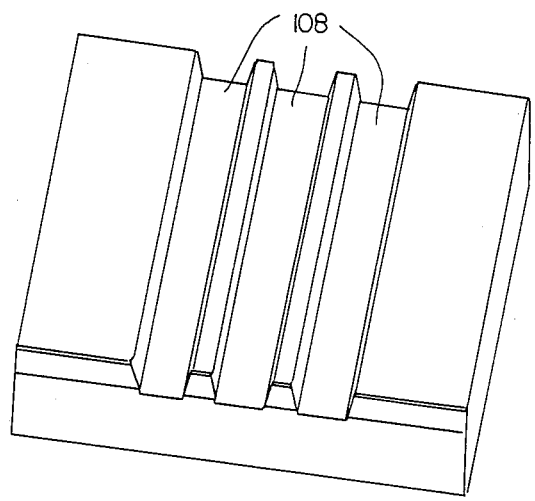
FIG. 5 is a perspective view showing a wafer of the conventional semiconductor laser array device shown in FIG. 4.
Figure 6:
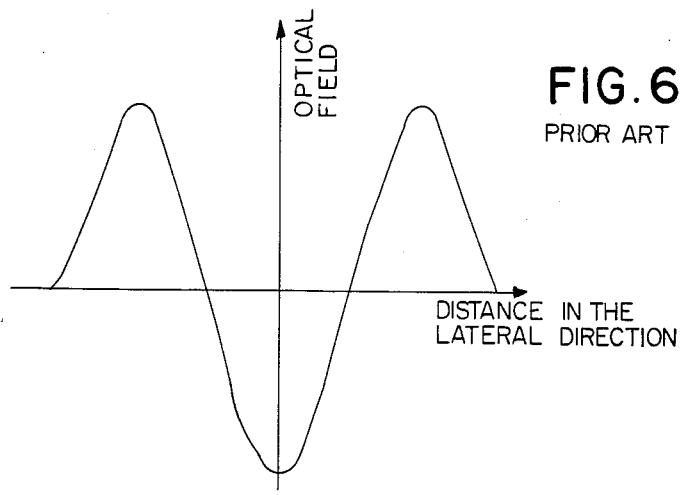
FIG. 6 is a graph showing the optical field distribution of the conventional semiconductor laser array device shown in FIG. 4.
Figure 7:
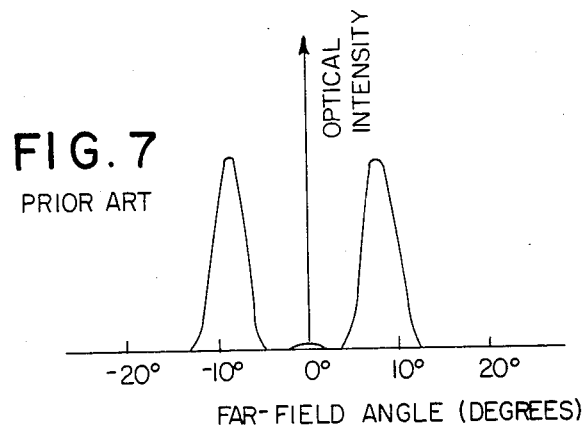
FIG. 7 is a graph showing the far-field pattern attained by the conventional semiconductor laser array device shown in FIG. 4.
Figure 8:
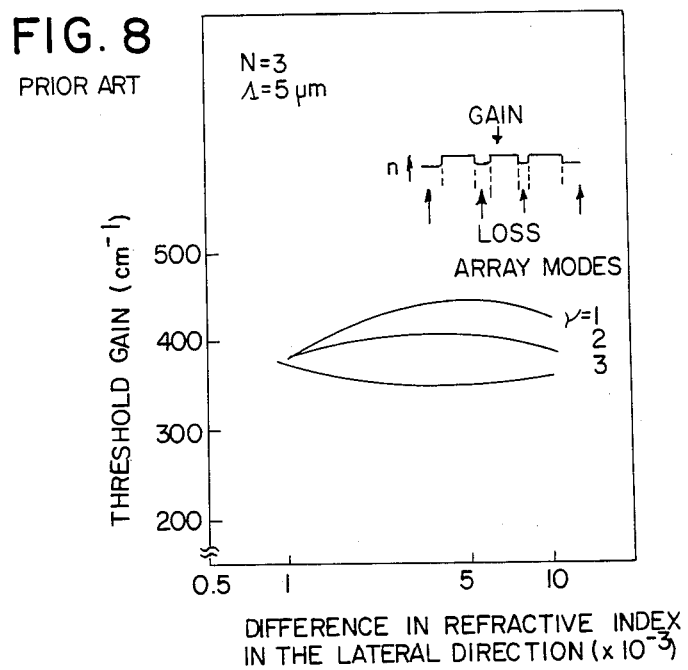
FIG. 8 is a graph showing the theoretical analysis of the array mode threshold gain of the conventional semiconductor laser array device shown in FIG. 4.
Figure 9:
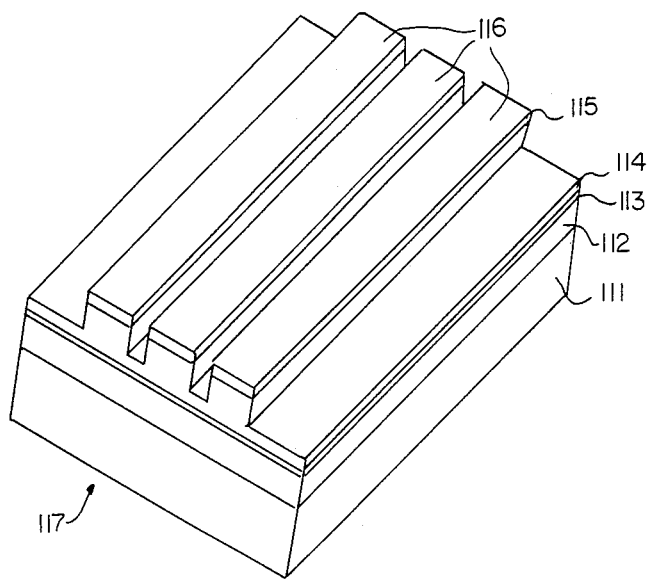
FIG. 9 is a perspective view showing another conventional semiconductor laser array device.

In fact, it was observed that the semiconductor laser array device obtained above produced an output power of as high as about 100 mW with a single diffraction limited beam corresponding to a 0° phase-shift mode. The far-field pattern attained by this laser array device is shown in FIG. 3, exhibiting a single peak.

This invention is not limited to the above-mentioned example, but it is, of course, applicable to devices having a lasing structure different from that of the above-mentioned example, devices having a polarity different from that of the above-mentioned example, devices using semiconductor materials therein different from those of the above-mentioned example, and devices in which the materials for the optical absorbent, the shape of the optical absorbent, and the position of the optical absorbent are different from the above-mentioned example.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A semiconductor laser array device comprising a substrate and a multi-layered crystal structure with an active layer for laser oscillating operation, said multi-layered crystal structure being disposed on said substrate, wherein an area of said multi-layered crystal structure that is positioned above said active layer has a mesa through which current is supplied to said active layer, said mesa extending from a first light-emitting facet to a second light-emitting facet and being composed of a single main portion and a plurality of parallel branching portions, said main portion of said mesa extending in the oscillation direction from said first light-emitting facet, each of both sides of said main portion of said mesa being buried by an optical absorbent layer by which light within said active layer is absorbed, resulting in a loss waveguide in the area of said mesa, said plurality of parallel branching portions extending from the end of said main portion of said mesa to said second light-emitting facet, both sides of each of said branching portions being free of any optical absorbent layer, resulting in a real index waveguide in the area of said active layer corresponding to said branching portion of said mesa, whereby an active waveguide corresponding to the shape of said mesa is formed within said active layer.

2. A semiconductor laser array device according to claim 1, wherein said mesa is formed into a "Y" shape.

* * * * *